United States Patent
Farrell

(10) Patent No.: US 8,369,178 B2
(45) Date of Patent: Feb. 5, 2013

(54) SYSTEM AND METHOD FOR MANAGING SELF-REFRESH IN A MULTI-RANK MEMORY

(75) Inventor: Todd D. Farrell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 354 days.

(21) Appl. No.: 12/719,795

(22) Filed: Mar. 8, 2010

(65) Prior Publication Data

US 2011/0219182 A1    Sep. 8, 2011

(51) Int. Cl.
*G11C 8/00*    (2006.01)

(52) U.S. Cl. .............. 365/230.03; 365/222; 365/233.13; 365/236

(58) Field of Classification Search ............. 365/230.03, 365/222, 233.13, 236
See application file for complete search history.

(56) References Cited

U.S. PATENT DOCUMENTS

| | | | | |
|---|---|---|---|---|
| 6,693,837 B2* | 2/2004 | Schaefer et al. | ............... | 365/222 |
| 2002/0163846 A1* | 11/2002 | Taruishi et al. | ............... | 365/222 |
| 2004/0268018 A1* | 12/2004 | Cowles et al. | ................... | 711/1 |

* cited by examiner

*Primary Examiner* — Toan Le
(74) *Attorney, Agent, or Firm* — Dorsey & Whitney LLP

(57) ABSTRACT

Multi-rank memories and methods for self-refreshing multi-rank memories are disclosed. One such multi-rank memory includes a plurality of ranks of memory and self-refresh logic coupled to the plurality of ranks of memory. The self-refresh logic is configured to refresh a first rank of memory in a self-refresh state in response to refreshing a second rank of memory not in a self-refresh state in response to receiving a non-self-refresh refresh command for the second rank of memory.

24 Claims, 3 Drawing Sheets

SYSTEM AND METHOD FOR MANAGING SELF-REFRESH IN A MULTI-RANK MEMORY

TECHNICAL FIELD

Embodiments of the invention relate generally to semiconductor memory, and more specifically, to multi-rank memory and performing self-refresh operations therein.

BACKGROUND OF THE INVENTION

Dynamic random access memory (DRAM) require periodic refreshing in order to retain data stored by the memory. Typically, DRAM can be refreshed by periodically issuing refresh commands to the memory, or by issuing a "self-refresh" command. For example, refresh commands can be issued in between memory operations, such as between read and write operations. In a self-refresh state, the memory manages refresh operations for itself using self-refresh circuitry until the state is exited by receiving a self-refresh exit command. Self-refresh is often used while the memory is inactive, and no memory operations in process or are pending.

Memory may be arranged in various configurations. One example is arranging a memory area into "ranks" of memory. Generally, the ranks of memory are independently addressable and may be managed separately, for example, ranks of DRAM may be separately refreshed so that one rank may be in operation while another refreshing. In another example, one rank of memory may be in a self-refresh state while another rank is receiving refresh commands (e.g., in between memory operations). Control over the ranks of memory, including self-refresh, is typically through command signals provided to the multi-rank memory, such as chip-select (CS) signals and clock enable (CKE) signals.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
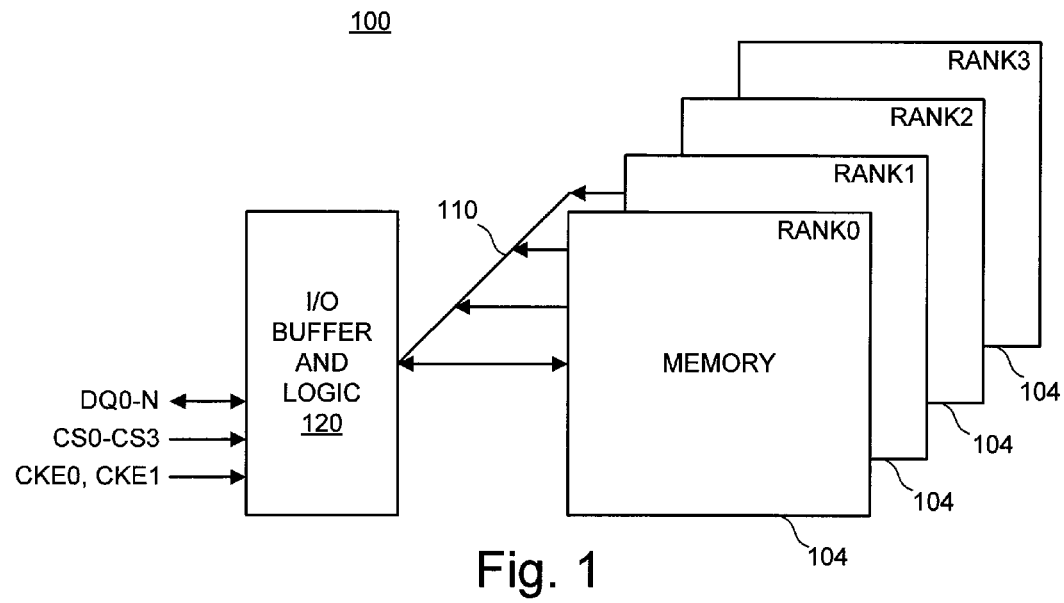
FIG. 1 is a block diagram of a multi-rank memory according to an embodiment of the invention.

FIG. 1 illustrates a portion of a multi-rank memory 100 according to an embodiment of the present invention. The multi-rank memory 100 includes a memory area divided into a plurality of ranks of memory 104. In the embodiment of FIG. 1, the memory area is divided into four ranks, RANK0-RANK3. Each of the ranks of memory 104 are coupled through a memory bus 110 to input/output (I/O) buffer and self-refresh logic 120. The I/O buffer and self-refresh logic 120 receives various signals for operation of the memory, for example, command, address, and data signals. Input buffers (not shown) of the I/O buffer and self-refresh logic 120 buffer the received signals and provide the command, address, and data signals to the ranks of memory 104 over the memory bus 110 to operate the memory 100 according to the command, address, and data signals it receives. The I/O buffer and self-refresh logic 120 is illustrated in FIG. 1 as specifically receiving chip select signals CS0-CS3 and clock enable signals CKE0, CKE1 and data signals DQ0-N in FIG. 1. However, as previously discussed, other memory signals may be received by the I/O buffer and self-refresh logic 120 as well, but are not shown in FIG. 1. The CS0-CS3 signals may be used to activate and deactivate a respective rank of memory 104 for operation. The CKE0, CKE1 signals may be used to control self-refresh operations for the ranks of memory 104.

The I/O buffer and self-refresh logic 120 provides a "single-load" to a device interacting with the memory. The loading resulting from the multiple ranks of memory 104 coupled to the memory bus 110 is managed by the I/O buffer and self-refresh logic 120 so that signals provided to the memory need to drive one load, rather than the loads for all of the multiple ranks of memory 104. The I/O buffer and self-refresh logic 120 receives command, address and data signals, which in response it provides internal memory signals on the memory bus 110 for operation of the ranks of memory 104. In some embodiments, control over the I/O buffer and self-refresh logic 120 is provided to one of the ranks of memory 104, such as in a master-slave arrangement where a "master" rank of memory controls the provision of at least some of the internal memory signals to "slave" ranks of memory.

For example, particular ones of the ranks of memory 104 can be activated or deactivated through the use of the CS0-CS3 signals in preparation for a memory operation to the ranks of memory 104. In an example operation, the I/O buffer and self-refresh logic 120 activates ranks of memory RANK0 and RANK2 in response to a low logic level CS0, CS2 signals, and activates ranks of memory RANK1 and RANK3 in response to a low logic level CS1, CS3 signals. In an active state a rank of memory 104 is ready to perform a memory operation, such as read operation. That is, in response to receiving a read command from an memory location in one of the ranks of memory 104, the I/O buffer and self-refresh logic 120 provides the internal memory signals to the activated ranks of memory 104 to read the data. Another example is a refresh command, which the I/O buffer and self-refresh logic 120 receives, and in response provides internal memory signals to activated ranks of memory 104 to perform a refresh operation. As known, refresh operations are performed to maintain the data states stored by the memory and may be performed by one or several of the ranks of memory based on the refresh command.

In another example, the I/O buffer and self-refresh logic 120 receives a self-refresh command for some or all of the ranks of memory 104. As with the refresh operation previously described, the self-refresh operation is performed to maintain the data states stored by the memory. In contrast, however, a self-refresh command places a rank of memory 104 into a mode where refresh operations are typically handled by internal circuitry and internally generated refresh commands refresh the rank of memory 104.

In some embodiments, self-refresh operations are invoked through the use of CKE0 and CKE1 signals. For example, a low logic level CKE signal for a rank of memory 104 invokes a self-refresh operation, and the particular ranks of memory 104 placed into self-refresh are controlled by which of the CKE0 and CKE1 signals are used (e.g., CKE0 for RANK0 and RANK2 and CKE1 for RANK1 and RANK3). In an example operation, self-refresh is invoked for ranks of memory RANK0 and RANK2, and ranks of memory RANK1 and RANK3 in response to low CKE0 and CKE1 signals, respectively. That is, in response to a low CKE0 signal, ranks of memory RANK0 and RANK2 are placed in self-refresh, and ranks of memory RANK1 and RANK3 may remain in a non-self-refresh state. Similarly, a low CKE1 signal invokes self-refresh of ranks of memory RANK1 and RANK3, and ranks of memory RANK0 and RANK 3 may remain in a non-self-refresh state.

For example, assuming ranks of memory RANK0-RANK3 are activated (e.g., CS0-CS3 are low), in response to ranks of memory RANK1 and RANK3 entering self-refresh (i.e., CKE1 goes low), the I/O buffer and self-refresh logic 120 prevents RANK1 and RANK3 from responding to any signals that may interrupt the self-refresh operation (other than exiting the self-refresh state) or cause erroneous operation. For example, input buffers associated with RANK1 and RANK3 may be disabled by the I/O buffer and self-refresh logic 120 to prevent receipt of any signals. In another example, chip select signals for memories of RANK1 and RANK3 are used to disable any memory operation other than self-refresh. In addition to preventing RANK1 and RANK3 from responding to spurious signals, refresh commands received by the I/O buffer and self-refresh logic 120 that are intended for refresh operations in ranks of memory RANK0 and RANK2 (still in a non-self-refresh state), which as previously discussed are necessary to maintain data states stored in memory, are also provided to ranks of memory RANK1 and RANK3 in order for those ranks of memory to be refreshed as well. In effect, the refreshing of ranks of memory RANK1 and RANK3 in response to entering self-refresh operation is accomplished by the (non-self) refresh commands for ranks of memory RANK0 and RANK2.

Similarly, assuming again that ranks of memory RANK0-RANK3 are activated (e.g., CS0-CS3 are low), in response to ranks of memory RANK0 and RANK2 entering self-refresh (i.e., CKE0 goes low), the I/O buffer and self-refresh logic 120 prevents RANK0 and RANK2 from responding to any signals that may interrupt the self-refresh operation (other than exiting the self-refresh state) or cause erroneous operation. Refresh commands received by the I/O buffer and self-refresh logic 120 that are intended for refresh operations in ranks of memory RANK1 and RANK3 (still in a non-self-refresh state) are also provided to ranks of memory RANK0 and RANK2 in order for those ranks of memory to be refreshed as well. In effect, the refreshing of ranks of memory RANK0 and RANK2 in response to entering self-refresh operation is accomplished by the (non-self) refresh commands for ranks of memory RANK1 and RANK3.

Figure 2:
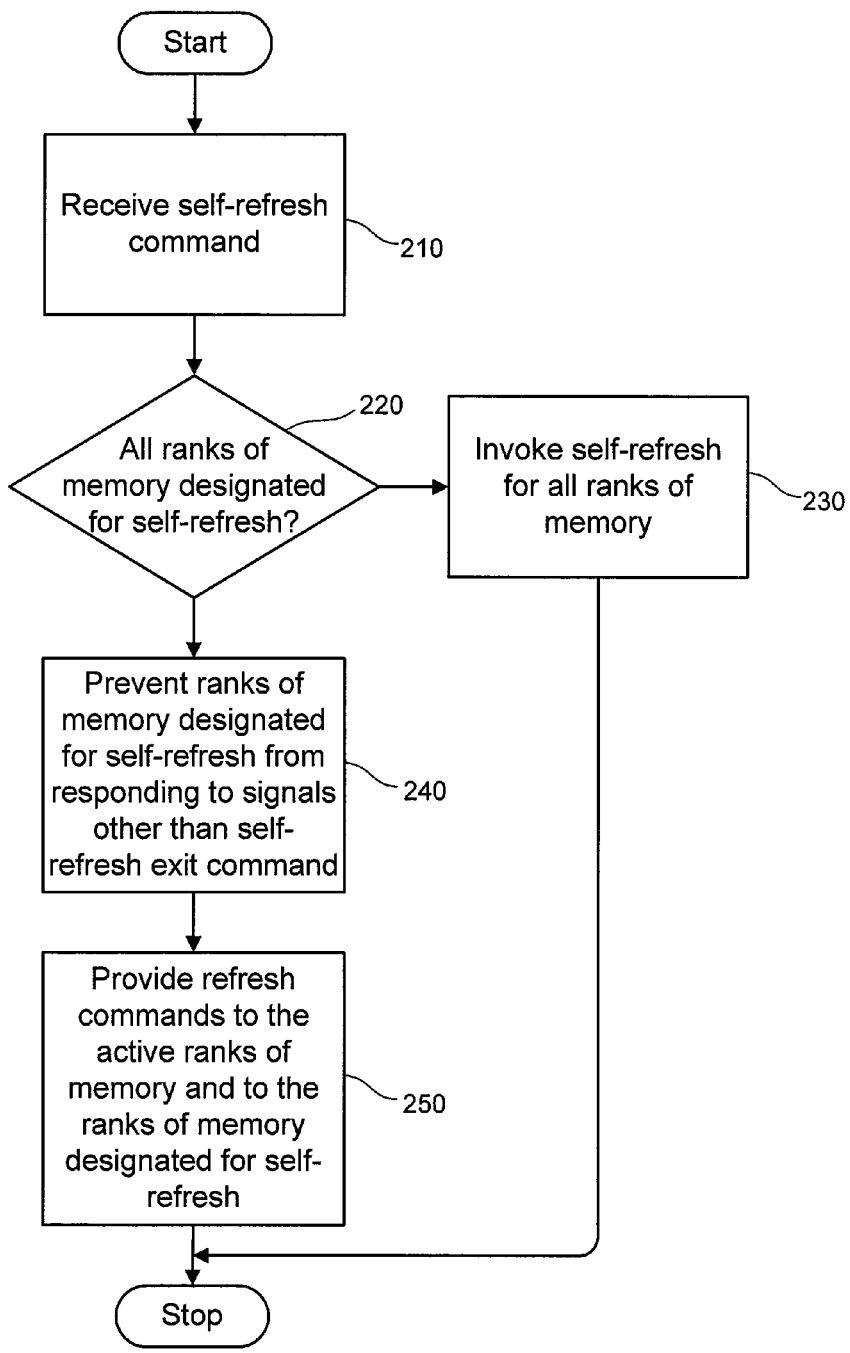
FIG. 2 is a flow diagram for performing a self-refresh operation according to an embodiment of the invention.

FIG. 2 illustrates a flow diagram for a self-refresh operation in accordance with an embodiment of the invention. At step 210 a self-refresh command for all or a subset of the ranks of memory is received. Where the self-refresh command is determined to be for all ranks of memory (step 220), self-refresh is invoked for all of the ranks of memory at step 230. If the self-refresh command is determined to be for less than all of the ranks of memory, at step 240 the ranks of memory to which the self-refresh command are directed are prevented from responding to command signals other than those for exiting self-refresh. At step 250 refresh commands directed to the ranks of memory not having self-refresh invoked are also provided to the ranks of memory in which self-refresh is invoked to (non-self) refresh those ranks of memory as well.

Figure 3:
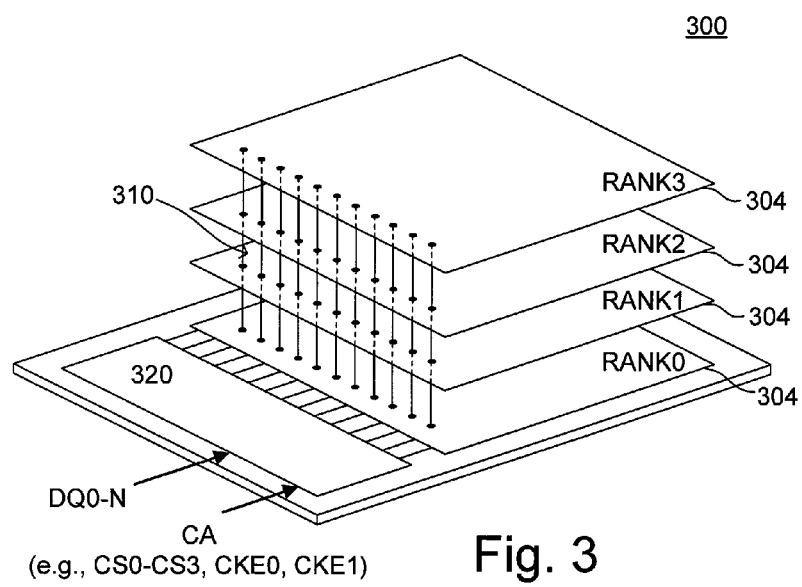
FIG. 3 is a block diagram of a multi-rank memory according to an embodiment of the invention.

FIG. 3 illustrates a portion of a multi-rank memory 300 according to an embodiment of the present invention. The multi-rank memory 300 is shown as having a "memory stack" configuration. A memory area of the multi-rank memory 300 is divided into a plurality of ranks of memory 304. The ranks of memory 304 are stacked on one another, and share a memory bus 310 formed by through-die vias. An I/O buffer and self-refresh logic 320 receives various signals for operation of the memory 300, for example, command and address signals CA, and data signals. The I/O buffer and self-refresh logic 320 buffer receive the signals at input buffers (not shown) and provides internal memory signals to the ranks of memory 304 over the memory bus 310 to operate the memory 300 according to CA signals and data signals it receives. Included in the CA signals are chip select signals CS0-CS3 and clock enable signals CKE0, CKE1, which may be used to control self-refresh of the ranks of memory 304.

As with the multi-rank memory 100 of FIG. 1, self-refresh of the ranks of memory 304 of the multi-rank memory 300 may be invoked using the CKE0 and CKE1 signals. In response to receiving self-refresh commands for less than all of the ranks of memory 304 (i.e., some ranks of memory remain in a non-self-refresh state), the I/O buffer and self-refresh logic 320 prevents the ranks of memory 304 to which the self-refresh command is directed from responding to any signals that may interrupt the self-refresh operation (other than exiting the self-refresh state) or cause erroneous operation. The I/O buffer further provides refresh commands directed to the activated ranks of memory to the self-refreshing ranks of memory as well. As a result, the ranks of memory in which self-refresh is invoked are also refreshed by the refresh commands directed to the non-self-refreshing ranks of memory.

Figure 4:
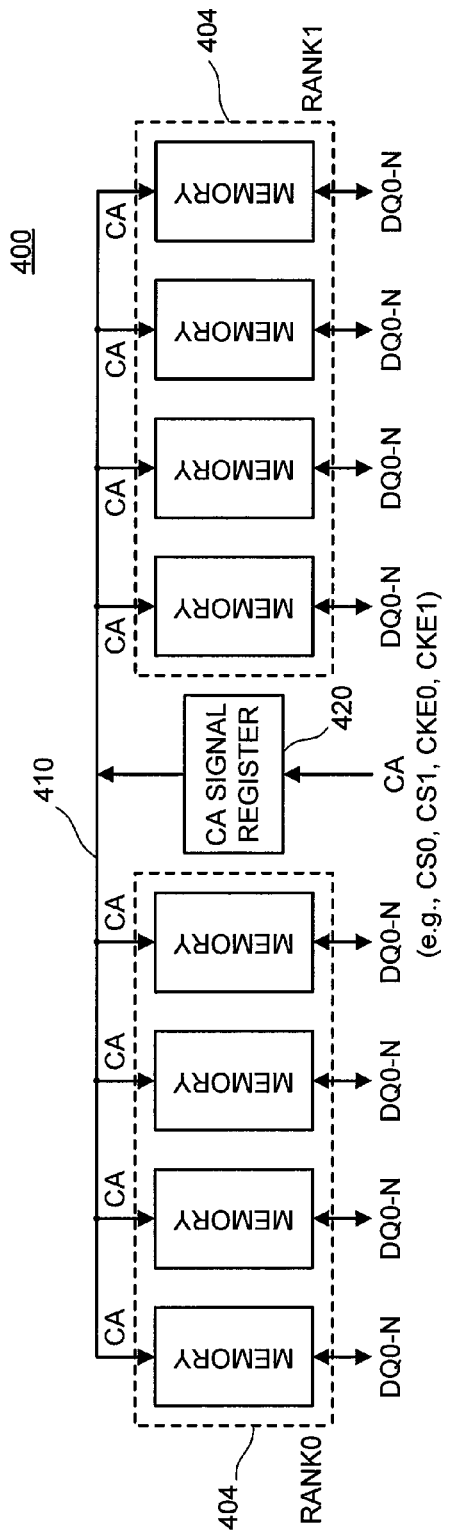
FIG. 4 is a block diagram of a multi-rank memory according to an embodiment of the invention.

FIG. 4 illustrates a portion of a multi-rank memory 400 according to an embodiment of the present invention. The multi-rank memory 400 includes a memory area divided into a plurality of ranks of memory 404. Each of the memories within a rank of memory 404 is coupled to a command and address CA memory bus 410. In some embodiments, the memories within a rank of memory are memory devices. The memories are also coupled to separate respective data busses. A CA register and self-refresh logic 420 is coupled to receive CA signals for operation of the memory 400. CA register receives the CA signals and provides internal memory signals to the ranks of memory 404 over the memory bus 410 to operate the memory 400 according to CA signals it receives. Included in the CA signals are chip select signals CS0, CS1, and clock enable signals CKE0, CKE1, which may be used to control self-refresh of the ranks of memory 404.

As with the multi-rank memory 100 of FIG. 1, self-refresh of the ranks of memory 404 of the multi-rank memory 400 may be invoked using the CKE0 and CKE1 signals. In response to receiving self-refresh commands for less than all of the ranks of memory 404 (i.e., some ranks of memory remain in a non-self-refresh state), the I/O buffer and self-refresh logic 420 prevents the ranks of memory 404 to which the self-refresh command is directed from responding to any signals that may interrupt the self-refresh operation (other than exiting the self-refresh state) or cause erroneous operation. The CA register and self-refresh logic 420 further provides refresh commands directed to the non-self-refreshing ranks of memory to the self-refreshing ranks of memory as well. As a result, the ranks of memory in which self-refresh is invoked are also refreshed by the refresh commands directed to the non-self-refreshing ranks of memory.

Figure 5:
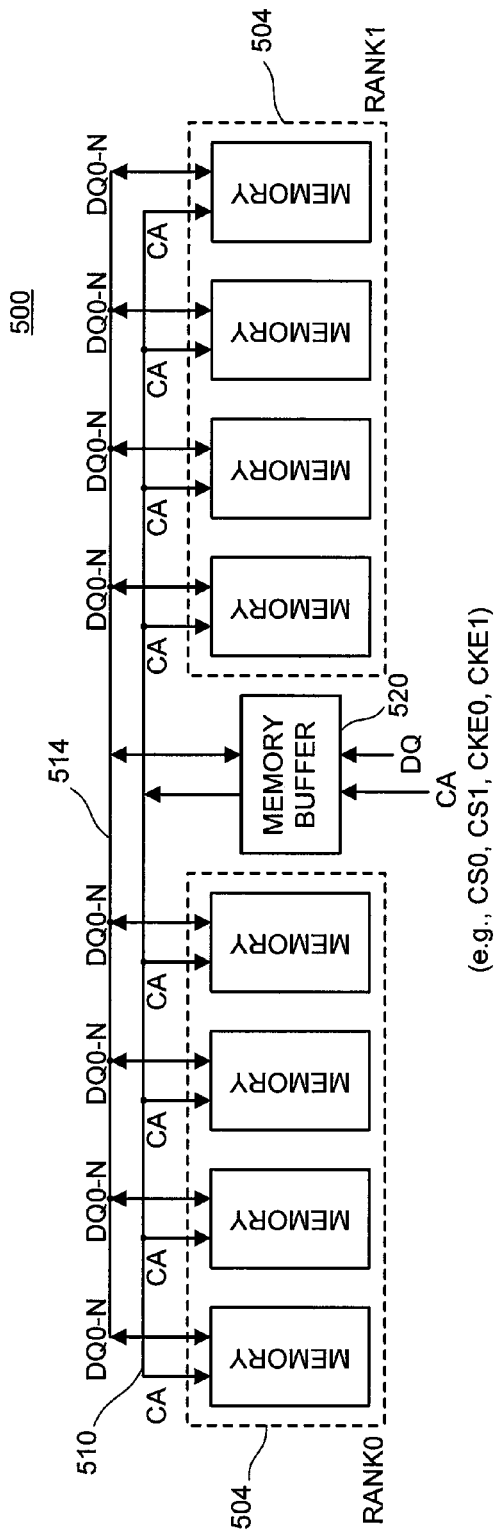
FIG. 5 is a block diagram of a multi-rank memory according to an embodiment of the invention.

FIG. 5 illustrates a portion of a multi-rank memory 500 according to an embodiment of the present invention. The multi-rank memory 500 includes a memory area divided into a plurality of ranks of memory 504. Each of the memories within a rank of memory 504 is coupled to a command and address CA memory bus 510 as well as to a data bus 514. In some embodiments, the memories within a rank of memory are memory devices. A memory buffer 520 receives various signals for operation of the memory 500, for example, command, address signals, and data signals. The memory buffer and self-refresh logic 520 buffer receive the signals and provides internal memory signals to the ranks of memory 504 over the CA bus 510 and data bus 514 to operate the memory 500 according to CA signals and data signals it receives. Included in the CA signals the memory buffer 520 receives are chip select signals CS0, CS1, and clock enable signals CKE0, CKE1, which may be used to control self-refresh of the ranks of memory 504.

As with the multi-rank memory 100 of FIG. 1, self-refresh of the ranks of memory 504 of the multi-rank memory 500 may be invoked using the CKE0 and CKE1. In response to receiving self-refresh commands for less than all of the ranks of memory 504 (i.e., some ranks of memory remain in a non-self-refresh state), the I/O buffer and self-refresh logic 520 prevents the ranks of memory 504 to which the self-refresh command is directed from responding to any signals that may interrupt the self-refresh operation (other than exiting the self-refresh state) or cause erroneous operation. The memory buffer 520 further provides refresh commands directed to the non-self-refreshing ranks of memory to the self-refreshing ranks of memory as well. As a result, the ranks of memory in which self-refresh is invoked are also refreshed by the refresh commands directed to the non-self-refreshing ranks of memory.

From the foregoing it will be appreciated that, although specific embodiments of the invention have been described herein for purposes of illustration, various modifications may be made without deviating from the spirit and scope of the invention. For example, the multi-rank memories illustrated and described with reference to FIGS. 1-5 may have been shown as having a specific number of ranks of memory, or receiving a specific number of chip-select and clock-enable signals. Other embodiments, however, may have fewer or greater ranks of memory or receive a different number of signals. Moreover, the present invention should not be limited to the particular configurations of multi-rank memories previously described. Accordingly, the invention is not limited except as by the appended claims.

What is claimed is:

1. A method for performing self-refresh in a multi-rank memory, comprising:
   receiving a self-refresh command for a designated rank of memory;
   preventing the designated rank of memory from responding to non-self-refresh exit commands;
   refreshing at least one other rank of memory responsive to a refresh command other than a self-refresh command; and
   refreshing the designated rank of memory in response to refreshing the at least one other rank of memory.

2. The method of claim 1 wherein receiving a self-refresh command comprises receiving a clock enable signal having a changed logic state.

3. The method of claim 1 wherein refreshing the designated rank of memory comprises providing refresh commands for the at least one other rank of memory to the designated rank of memory.

4. The method of claim 1 wherein preventing the designated rank of memory from responding to non-self-refresh exit commands comprises disabling an input buffer for a chip-select signal associated with the designated rank of memory.

5. The method of claim 1 wherein receiving a self-refresh command for a designated rank of memory comprises receiving self-refresh commands for less than all ranks of memory for the multi-rank memory.

6. The method of claim 1 wherein receiving a self-refresh command for a designated rank of memory comprises receiving a first clock enable signal associated with the designated rank of memory and having a first logic level, the method further comprising maintaining a second clock enable signal associated with the at least one other rank of memory at a second logic level opposite of the first logic level.

7. A method for self-refreshing a rank of memory of a multi-rank memory, comprising:
   disabling at least one input signal buffer of the rank of memory; and
   refreshing both the rank of memory to be self-refreshed and another rank of memory not to be self-refreshed in response to a refresh command directed to the another rank of memory not to be self-refreshed.

8. The method of claim 7 wherein disabling at least one input signal buffer of the rank of memory comprises disabling an input buffer for a chip-select signal associated with the rank of memory.

9. The method of claim 7 wherein the refresh command directed to the another rank of memory is not a self-refresh command.

10. The method of claim 7 refreshing both the rank of memory to be self-refreshed and another rank of memory comprises applying the refresh command directed to the another rank of memory to the rank of memory to be self-refreshed.

11. The method of claim 7 wherein the rank of memory to be self-refreshed is associated with a first clock enable signal and the another rank of memory not to be self-refreshed is associated with a second clock enable signal.

12. A multi-rank memory, comprising:
   a plurality of ranks of memory; and
   self-refresh logic coupled to the plurality of ranks of memory and configured to refresh a first rank of memory in a self-refresh state in response to refreshing a second rank of memory not in a self-refresh state in response to receiving a non-self-refresh refresh command for the second rank of memory.

13. The multi-rank memory of claim 12, further comprising:
   input/output buffers coupled to the plurality of ranks of memory and configured to provide internal memory signals for operating the ranks of memory in response to receiving memory commands.

14. The multi-rank memory of claim 12, further comprising:
   a command and address register coupled to the plurality of ranks of memory and configured to receive command and address signals, the command and address register further configured to provide command and address signals to the ranks of memory for operation of the same in accordance with the command and address signals.

15. The multi-rank memory of claim 12, further comprising:
    a memory buffer coupled to the plurality of ranks of memory and configured to receive command and data signals, the memory buffer further configured to provide the command and address signals to the ranks of memory for operation of the same.

16. The multi-rank memory of claim 12 wherein the self-refresh logic is further configured to prevent the first rank of memory from responding to any signals that may interrupt the self-refresh operation other than exiting the self-refresh state.

17. The multi-rank memory of claim 12 wherein the self-refresh logic is controlled by a master rank of memory and at least one of the other ranks of memory is a slave rank of memory.

18. A multi-rank memory, comprising:
    a plurality of ranks of memory;
    an input/output (I/O) buffer coupled to the plurality of ranks of memory, the I/O buffer configured to provide memory signals to the plurality of ranks of memory for operation in response to receiving memory commands, the I/O buffer including self-refresh logic configured to enable refreshing of both first and second ranks of memory in response to a refresh command for the second rank of memory during a self-refresh state of the first rank of memory.

19. The multi-rank memory of claim 18 wherein the plurality of ranks of memory comprise stacked ranks of memory.

20. The multi-rank memory of claim 18, further comprising a command and address bus coupled to the plurality of ranks of memory on which the memory signals are provided.

21. The multi-rank memory of claim 20 wherein the command and address bus comprises a bus formed using through-die vias.

22. The multi-rank memory of claim 18 wherein each of the ranks of memory comprise at least one memory device.

23. The multi-rank memory of claim 22 wherein the at least one memory device of each rank of memory is coupled to a respective data bus.

24. The multi-rank memory of claim 20 wherein the I/O buffer is configured to forward non-self-refresh commands directed to the second rank of memory to the first rank of memory while in the self-refresh state.

* * * * *

UNITED STATES PATENT AND TRADEMARK OFFICE
CERTIFICATE OF CORRECTION

| | | |
|---|---|---|
| PATENT NO. | : 8,369,178 B2 | Page 1 of 1 |
| APPLICATION NO. | : 12/719795 | |
| DATED | : February 5, 2013 | |
| INVENTOR(S) | : Todd D. Farrell | |

It is certified that error appears in the above-identified patent and that said Letters Patent is hereby corrected as shown below:

On Title Page, Item (57), under "Abstract", column 2, line 8, after "non-self-refresh" delete "refresh".

In the Claims

In column 6, line 52, in Claim 12, after "non-self-refresh" delete "refresh".

Signed and Sealed this
Thirtieth Day of April, 2013

Teresa Stanek Rea
*Acting Director of the United States Patent and Trademark Office*